(12) United States Patent
Akahori et al.

(10) Patent No.: US 9,417,264 B2
(45) Date of Patent: Aug. 16, 2016

(54) CURRENT APPLICATION DEVICE AND MANUFACTURING METHOD OF SEMICONDUCTOR ELEMENT

(71) Applicant: HONDA MOTOR CO., LTD., Tokyo (JP)

(72) Inventors: Shigeto Akahori, Tochigi (JP); Hitoshi Saito, Tochigi (JP); Hiroyuki Yamagishi, Tochigi (JP); Shinyu Hirayama, Tochigi (JP); Satoshi Hasegawa, Tochigi (JP); Yoko Yamaji, Tochigi (JP); Koichiro Sato, Tochigi (JP); Machie Saitou, Tochigi (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 14/589,190

(22) Filed: Jan. 5, 2015

(65) Prior Publication Data

US 2015/0194353 A1   Jul. 9, 2015

(30) Foreign Application Priority Data

Jan. 9, 2014   (JP) .................. 2014-002477

(51) Int. Cl.
*G01R 1/073*   (2006.01)
*G01R 31/26*   (2014.01)
*G01R 1/04*   (2006.01)

(52) U.S. Cl.
CPC .......... *G01R 1/07364* (2013.01); *G01R 1/0466* (2013.01); *G01R 31/2601* (2013.01)

(58) Field of Classification Search
CPC ......... H01L 24/03; H01L 24/05; H01L 24/11; H01L 24/13; H01L 21/2605; H01L 21/561; H01L 29/0696; H01L 29/66333; H01L 29/7395
See application file for complete search history.

(56) References Cited

U.S. PATENT DOCUMENTS

2014/0193928 A1*   7/2014   Hasegawa .......... G01R 1/06777
                                                         438/17

FOREIGN PATENT DOCUMENTS

| JP | 2001-124799 | 5/2001 |
| JP | 2007-218675 | 8/2007 |
| JP | 2011-064664 | 3/2011 |

OTHER PUBLICATIONS

Japanese Office Action dated Aug. 11, 2015, 3 pages.

* cited by examiner

*Primary Examiner* — Kyoung Lee
(74) *Attorney, Agent, or Firm* — Rankin, Hill & Clark LLP

(57) ABSTRACT

Provided are a current application device capable of improving the electrical contact between projections of a contact section and a surface electrode when applying a test current to a semiconductor element, and a method of manufacturing a semiconductor element properly tested by using the current application device. The current application device includes a contact section that has a plurality of projections, which are brought into contact with a surface electrode of a semiconductor element to apply a test current, and a pressing section that presses the contact section against the semiconductor element such that the projections penetrate a film to come in contact with the surface electrode. The contact section has a plurality of the projections on a plane that has been formed in a curved shape, and the curved-shaped plane is deformed into a planar shape by being pressed by the pressing section.

7 Claims, 9 Drawing Sheets

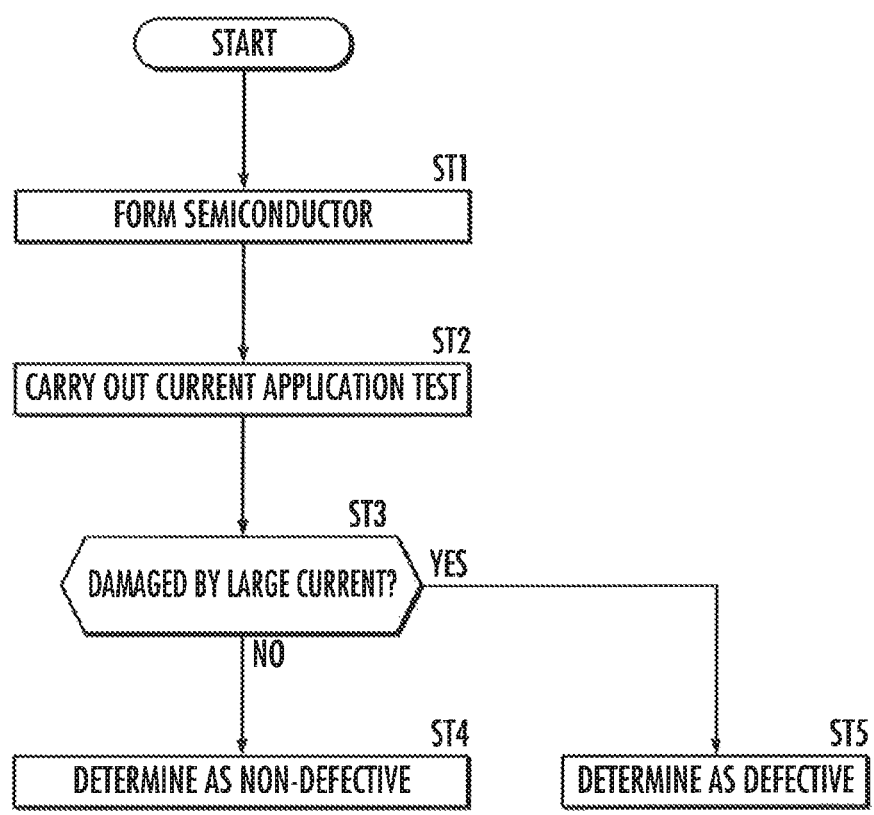

CURRENT APPLICATION DEVICE AND MANUFACTURING METHOD OF SEMICONDUCTOR ELEMENT

BACKGROUND OF THE INVENTION

1. Field of the Invention

The present invention relates to a current application device which applies a test current to a semiconductor element, and a manufacturing method of a semiconductor element which uses the same to carry out an inspection.

2. Description of the Related Art

Generally, a semiconductor element testing device used for inspecting a semiconductor element is provided with a current application device which applies, to a semiconductor element, a test current for testing the electrical characteristics of the semiconductor element. Conventionally, as such a current application device, there has been known the one in which a test current is applied via a planar contact section (a probe) having a projection group composed of a plurality of projections arranged at predetermined intervals (refer to, for example, Japanese Patent Application Laid-Open No. 2007-218675).

In the current application device, a test current is applied by pressing a contact section against a semiconductor element by springs such that each of the projections constituting a projection group comes in contact with a contact area in an active area of the semiconductor element. At this time, the distal end of each projection penetrates an electrical insulation film, which covers a surface electrode of the semiconductor element, so as to come in contact with the surface electrode, thus allowing a test current to be applied to the semiconductor element.

When carrying out the testing as described above, the projections of the contact section are required to secure good contact with the surface electrode so as to test the electrical characteristics of the semiconductor element with higher accuracy.

SUMMARY OF THE INVENTION

An object of the present invention is to provide a current application device capable of improving the electrical contact between a projection of a contact section and a surface electrode when a test current is applied to a semiconductor element, and a method of manufacturing a semiconductor element properly tested using the same.

A current application device in accordance with the present invention that applies a test current to a semiconductor element having at least a part of a surface electrode covered with an electrical insulation film, includes: a contact section having a plurality of projections that penetrate the film to come in contact with the surface electrode so as to apply the test current to the semiconductor element; and a pressing section that presses the contact section against the semiconductor element such that the projections penetrate the film to come in contact with the surface electrode, wherein the contact section has the plurality of projections on a plane formed in a curved shape, and the plane of the curved shape is deformed into a planar shape when pressed by the pressing section.

In the current application device according to the present invention, the plurality of projections is formed on the curved plane of the contact section. Among the plurality of projections, the projections provided in an area that is substantially parallel to the surface of the semiconductor element on the curved plane are oriented in the pressing direction in which the pressing section presses, and the projections provided in an area inclined relative to the surface of the semiconductor element on the curved plane are oriented in the direction inclined relative to the pressing direction. In this case, the orientations of the projections refer to the directions from the central position of the proximal ends of the projections toward the distal ends thereof.

When the test current is applied to the semiconductor element to be tested, pressing the curved plane of the contact section against the surface of the semiconductor element by the pressing section causes the plane of the contact section to be deformed from the curved shape to a planar shape. Accordingly, the projections provided in the area inclined relative to the surface of the semiconductor element on the curved plane of the contact section change the directions thereof to the pressing direction so as to scrape off and penetrate the film of the semiconductor element, thereby coming in contact with a surface electrode. At this time, in the semiconductor element, the film of the area with which the distal ends of the projections come in contact is scraped off by the distal ends of the projections, so that a larger portion of the surface electrode is exposed by the scraping-off.

Therefore, the current application device in accordance with the present invention exposes more of the surface electrode of the semiconductor element than by a conventional current application device, thus improving the electrical contact between the projections of the contact section and the surface electrode when the test current is applied to the semiconductor element. This enables the current application device in accordance with the present invention to test the electrical characteristics of a semiconductor element with higher accuracy.

When the test current is applied to a semiconductor element, current concentration takes place in a peripheral portion of the semiconductor element in some cases, so that it is desired to further improve the electrical contact to reduce contact resistance in the peripheral portion.

Hence, in the current application device in accordance with the present invention, the plane of the contact section that has the plurality of projections is preferably curved such that the central portion thereof projects toward the opposite side of the semiconductor element and the peripheral portion thereof projects toward the semiconductor element side.

In this case, in a normal state wherein the contact section maintains the curved shape, the projections provided in the peripheral portion of the contact section are oriented in the direction inclined relative to the direction of pressing by the pressing section, and the inclination relative to the pressing direction increases as the projections are closer to the peripheral portion of the contact section away from the central portion.

Therefore, at the time of testing, when the contact section is pressed against the semiconductor element to deform the plane of the contact section from the curved shape to the planar shape, greater displacements of the projections provided at positions closer to the peripheral portion of the contact section will result as the directions thereof are changed to the pressing direction, so that the movement distances of the distal ends of the projections will be greater accordingly. Thus, in an area of the semiconductor element that is closer to the peripheral portion thereof, more of the film is scraped off by the distal ends of the projections, causing the contact area to be exposed more.

Thus, the electrical contact between the projections of the contact section and the surface electrode can be improved with resultant reduced contact resistance even in the peripheral portion of the semiconductor element.

Further, in the current application device in accordance with the present invention, the projections may be pyramidal but more preferably frustum-shaped. If the projections are pyramidal, then the film of the semiconductor element is scraped off as the single apex of the distal end of the pyramid moves. Meanwhile, if the projections are frustum-shaped, then the film is scraped off as the upper end surface of the frustum moves, scraping off more of the film than the case where the pyramidal projections are used. Therefore, the use of the frustum-shaped projections further increases the exposed area of the surface electrode, so that the electrical contact will be further improved, permitting reduced contact resistance.

More preferably, the projections have a truncated square pyramid shape, and the length of one side of the truncated square pyramid shape is larger than the arithmetic mean roughness of the uneven surface of the semiconductor element. This enables the distal surfaces of the projections to span over recessions of the semiconductor element when bringing the distal surfaces of the projections into contact with the surface electrode of the semiconductor element, thus permitting further improved electrical contact.

Further, a manufacturing method of a semiconductor element in accordance with the present invention includes: a formation step for forming a semiconductor element having at least a part of a surface electrode covered with an electrical insulation film; a current application step for pressing a contact section, which is provided with a plurality of projections on a plane formed in a curved shape, against the semiconductor element formed by the formation step thereby to deform the plane of the contact section that has the curved shape into a planar shape and then scraping off and penetrating the film by the projections thereby to bring the projections into contact with the surface electrode to apply a test current; and a determination step for determining whether or not the semiconductor element to which the test current is applied in the current application step satisfies a predetermined performance according to the test current.

In the manufacturing method of a semiconductor element in accordance with the present invention, first, in the formation step, a semiconductor element having at least a part of a surface electrode covered with an electrical insulation film is formed.

Then, in the current application step, the contact section is pressed against the semiconductor element, which has been formed in the formation step, to penetrate the film of the semiconductor element by the projections to bring the projections into contact with the surface electrode thereby to apply the test current.

When the contact section is pressed against the semiconductor element, the plane of the contact section that has the curved shape is deformed into a planar shape. Accordingly, the projections provided in an area that is substantially parallel to the surface of the semiconductor element on the curved plane of the contact section change the directions thereof to the pressing direction so as to scrape off and penetrate the film of the semiconductor element to come in contact with the surface electrode. At this time, in the semiconductor element, the distal ends of the projections scrape off the film of the area with which the distal ends of the projections come in contact, so that a larger portion of the surface electrode will be exposed by the scraping-off. As a result, when the test current is applied to the semiconductor element, the electrical contact between the projections of the contact section and the surface electrode improves, making it possible to test the electrical characteristics of the semiconductor element with higher accuracy.

Further, in the determination step, it is determined whether or not the semiconductor element to which the test current is applied in the current application step satisfies a predetermined performance according to the test current.

Thus, the manufacturing method of a semiconductor element in accordance with the present invention allows the electrical characteristics of the semiconductor element to be tested with higher accuracy in the current application step, so that a semiconductor element that has been properly tested can be manufactured.

Further, in the manufacturing method of a semiconductor element in accordance with the present invention, the distance of scraping-off of the film by the plurality of projections preferably increases as the positions of the projections provided on the contact section are closer to a peripheral portion away from a central portion. With this arrangement, more of the film of an area of the semiconductor element that is closer to the peripheral portion thereof will be scraped off by the distal ends of the projections, exposing a larger contact area. Thus, even in the peripheral portion of the semiconductor element, the electrical contact between the projections of the contact section and the surface electrode improves, leading to reduced contact resistance.

BRIEF DESCRIPTION OF THE DRAWINGS

FIGS. 5A-5B illustrate an exemplary projection provided on the contact section illustrated in FIG. 3, wherein FIG. 5A is a front view and FIG. 5B is a plan view;

FIGS. 8A-8C are diagrams illustrating a modification of the projection, wherein FIG. 8A is a front view, FIG. 8B is a plan view, and FIG. 8C is a diagram illustrating the movement of the distal surface of the projection on the surface of the semiconductor element; and FIG. 9 is a flowchart illustrating the process of a manufacturing method of a semiconductor element properly tested using the current application device illustrated in FIG. 1.

DESCRIPTION OF THE PREFERRED EMBODIMENTS

The following will describe embodiments of the present invention with reference to the accompanying drawings. A current application device of the embodiment, which receives current supplied from an external power source, is used to apply a test current for testing a semiconductor element to a semiconductor element and especially suited for testing a power semiconductor element used for switching a large current ranging from about 400 A to about 2000 A. Such a semiconductor element is, for example, an insulated gate bipolar transistor (IGBT) or a power MOSFET, at least a part of the surface electrode being insulated with an electrical insulation film. In the present embodiment, the description will be given of the case of a semiconductor element provided with an active area and a contact area on the opposite side from the electrical insulation film of the surface electrode; the present invention, however, is not limited thereto.

Figure 1:
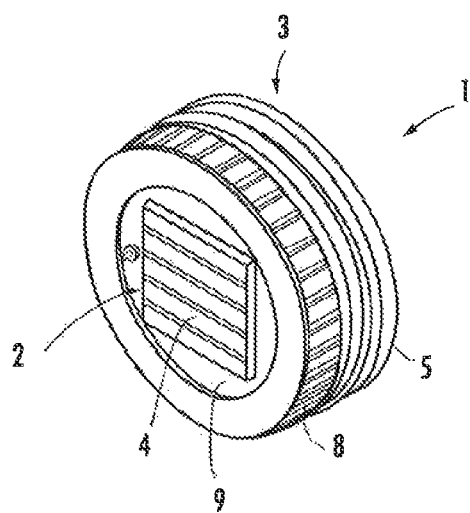
FIG. 1 is a perspective view of a current application device according to an embodiment of the present invention.
Figure 2:
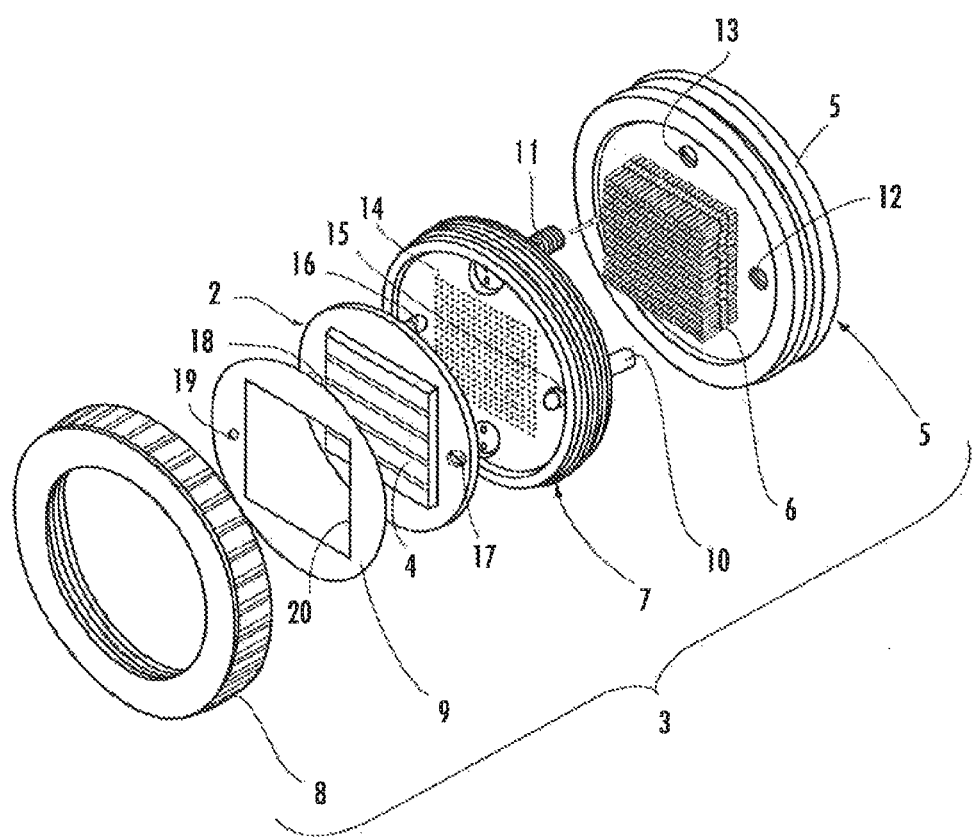
FIG. 2 is an exploded perspective view of the current application device illustrated in FIG. 1.

As illustrated in FIG. 1 and FIG. 2, a current application device 1 includes a disk-shaped contact section 2, which is connected to an external power source (not illustrated) to receive a test current to be applied to a semiconductor element to be tested, and a pressing assembly 3, which holds the contact section 2 and presses the same against the semiconductor element.

The contact section 2 has a contact surface 4 on which a group of projections is provided, which will be discussed later, on a side thereof where the semiconductor element to be tested is placed (hereinafter simply referred to as "the element side"). The pressing assembly 3 has a substantially cylindrical shape and holds the contact section 2 therein. The pressing assembly 3 holds the contact section 2 such that the contact surface 4 is substantially perpendicular to the direction of the axis of the cylindrical shape (hereinafter simply referred to as "the axial direction") and presses the same against the semiconductor element along the axial direction.

As illustrated in FIG. 2, the pressing assembly 3 includes a disk-shaped base section 5, a number of pins with springs 6 arranged vertically and horizontally at predetermined intervals on the surface on the element side of the base section 5, a disk-shaped guide support section 7 which supports the pins with springs 6 in a direction perpendicular to the axial direction and guides the same along the axial direction, a ring-shaped attaching section 8 for attaching the contact section 2 to the element side of the guide support section 7, an insulation plate 9 which insulates the contact section 2 and the attaching section 8, and a cylindrical pin 10 which guides the contact section 2 in the axial direction.

The guide support section 7 is fixed in parallel to the base section 5 by a fixing screw 11. The base section 5 has a positioning hole 12 for positioning by inserting an end portion of the cylindrical pin 10 on the opposite side from the element side, and a screw hole 13 into which the fixing screw 11 is screwed.

The guide support section 7 has a guide hole group 14, which supports the pins with springs 6 in the direction perpendicular to the axial direction and guides the same in the axial direction and which is composed of the same number of through holes as the number of the pins with springs 6, a guide hole 15 as a through hole that supports the cylindrical pin 10 in the direction perpendicular to the axial direction and guides the same in the axial direction, and a cylindrical projecting section 16 vertically provided on the surface on the element side.

The outer periphery of the guide support section 7 is provided with a male screw for fixing the attaching section 8 to the guide support section 7. The guide hole group 14 is arranged in a rectangular pattern matching the contact surface 4 of the contact section 2 on the element side surface of the guide support section 7. More specifically, the pins with springs 6 guided by the guide hole group 14 support the surface of the contact section 2 on the opposite side from the contact surface 4 in an area that exactly matches the contact surface 4.

The guide hole 15 and the projecting section 16 are positioned outside of two opposing sides of the rectangular pattern. The contact section 2 is provided with through holes 17 and 18 at the positions that match the guide hole 15 and the projecting section 16. The portion of the contact section 2 that constitutes the contact surface 4 juts out toward the element side via steps and forms a square area by a rectangular platform section.

The insulation plate 9 has an aperture 19 in which the projecting section 16 of the guide support section 7 is inserted and an opening section 20 in which the platform section constituting the contact surface 4 is inserted. The insulation plate 9 has an outside diameter that fits the inner wall of the attaching section 8. The inner wall of the attaching section 8 is provided with a female screw that matches the male screw of the guide support section 7. The end surface of the attaching section 8 on the element side opens with an inside diameter that is slightly smaller than the outside diameter of the insulation plate 9.

Figure 3:
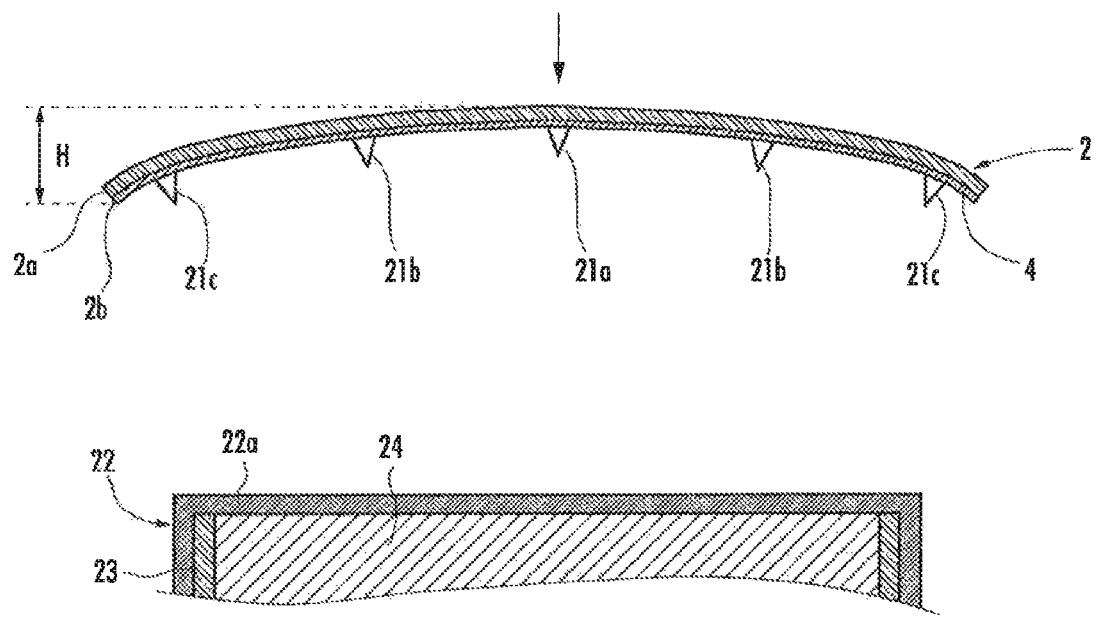
FIG. 3 presents the sectional views of a contact section in the current application device illustrated in FIG. 1 and a semiconductor element to which a test current is applied.

As illustrated in FIG. 3, the contact section 2 is formed by depositing a hard Ni film 2b having a thickness of, for example, 50 μm on a Ni sheet 2a measuring, for example, 1 cm long, 1 cm wide and 650 μm thick, the hard Ni film 2b constituting the contact surface 4 facing a semiconductor element 22. The contact section 2 is curved such that the central portion thereof projects toward the opposite side from the semiconductor element 22 (toward the Ni sheet 2a) and the peripheral portion thereof projects toward the semiconductor element 22 (toward the Ni film 2b), a height H of the curvature being, for example, 15 μm.

Figure 4:
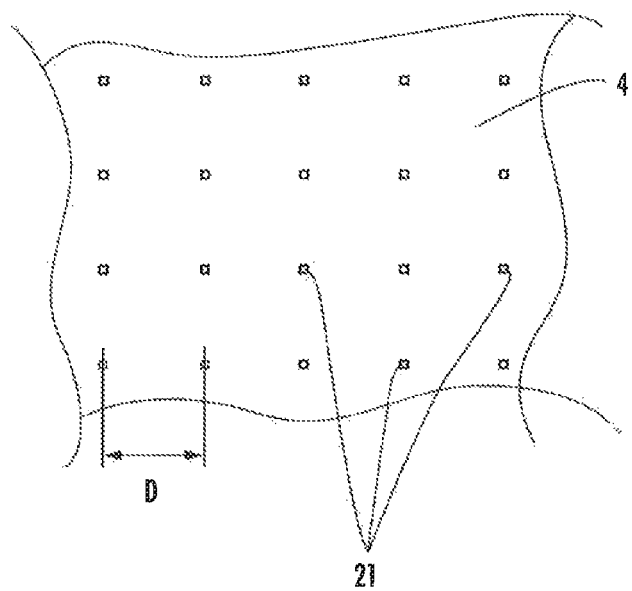
FIG. 4 is an enlarged view of a part of the contact section in the current application device illustrated in FIG. 1.

As illustrated in FIG. 4, the projection group consisting of a plurality of projections 21 is provided on the contact surface 4 of the contact section 2, which is formed in the curved shape. The projections 21 are arranged in a matrix pattern on the contact surface 4 at a predetermined pitch D of, for example, approximately 0.5 mm. A test current supplied to the contact section 2 flows through the projections 21 into a surface electrode 22a of the semiconductor element 22 to be tested.

Figure 5A:
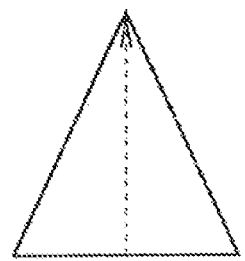

As illustrated in FIG. 3, among a plurality of projections 21, projections 21a provided in an area substantially parallel to the surface of the semiconductor element 22 on the contact surface 4 are oriented in the direction of pressing by the pressing assembly 3 (the direction indicated by the arrow in the drawing), while projections 21b and 21c provided in an area on the contact surface 4, which area is inclined relative to the surface of the semiconductor element 22, are oriented in directions inclined relative to the direction of pressing. In this case, the orientation of each of the projections 21 refers to the direction from the central position of the proximal end of each of the projections 21 toward the distal end thereof, as illustrated in FIG. 5A. The projections 21 closer to the peripheral portion of the contact surface 4 away from the central portion thereof incline more relative to the pressing direction. More specifically, the inclination increases in the order of the projections 21a, 21b and 21c.

When the projection group on the contact surface 4 is pressed against the surface of the semiconductor element 22 to be tested, the distal ends of the projections 21 penetrate an electrical insulation film on the surface of the semiconductor element 22 illustrated in FIG. 3 to come in good contact with the surface electrode 22a. This allows the test current to be applied to a contact area 24 on the inner side of an active area 23 through the surface electrode 22a.

Figure 5B:
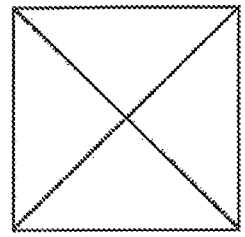

FIG. 5A is a front view illustrating the shape of a single projection 21, and FIG. 5B is a plan view thereof As illustrated in FIG. 5A, the projection 21 is formed to have a square pyramid shape measuring, for example, 10 μm long, 10 μm wide, and 5 ηm high. The current application device 1 can be assembled as described below. First, the pins with springs 6 are loaded to the guide hole group 14 of the guide support section 7 and the guide support section 7 is attached to the base section 5 by two fixing screws 11. Then, the cylindrical pin 10 is inserted into the guide hole 15 of the guide support section 7, and the end portion of the cylindrical pin 10 is inserted into the positioning hole 12 of the base section 5.

Next, the contact section 2 is placed on the element side of the guide support section 7 such that the cylindrical pin 10 and the projecting section 16 of the guide support section 7 are inserted into the through holes 17 and 18, respectively, of the contact section 2. Then, the insulation plate 9 is placed on the element side of the contact section 2 such that the platform section constituting the contact surface 4 of the contact section 2 is inserted into the opening section 20 of the insulation plate 9 and the projecting section 16 of the guide support section 7, which juts out of the through hole 18 of the contact section 2, is inserted into the aperture 19.

Subsequently, the female screw of the attaching section 8 is fastened onto the male screw of the guide support section 7 thereby to fix the attaching section 8 to the guide support section 7. This completes the assembly of the current application device 1, and the contact section 2 and the pressing assembly 3 will be in the state illustrated in FIG. 1.

In this state, the area in the surface of the contact section 2 on the opposite side from the contact surface 4, which area matches the contact surface 4, is supported on the base section 5 while being urged toward the element side at the same time by a number of pins with springs 6. Further, the contact section 2 is positioned in the direction perpendicular to the axial direction by the cylindrical pin 10 and the projecting section 16 and is slightly movably guided in the axial direction.

Thus, when the contact section 2 is pressed against the surface of the semiconductor element 22 to be tested, if there is a difference in inclination between the surface and the contact surface 4, then the contact section 2 is capable of slightly tilting to accommodate the difference.

Figure 6:
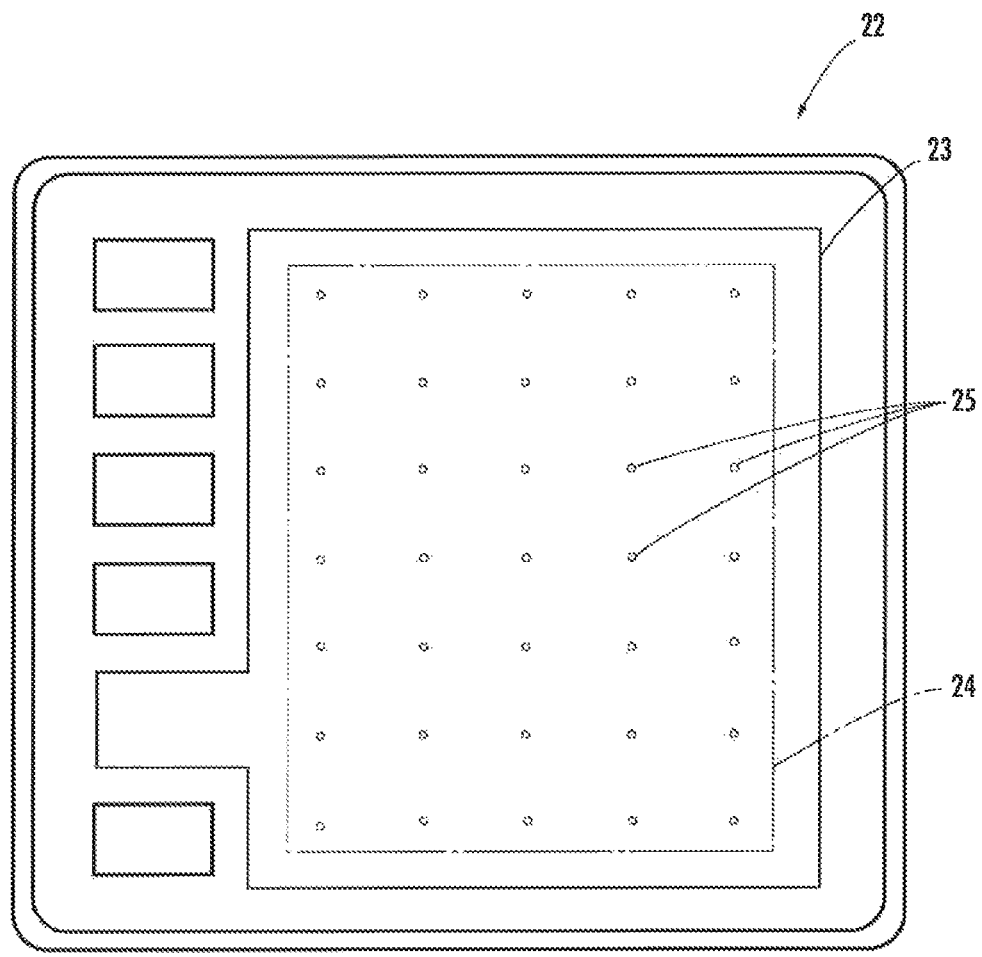
FIG. 6 is a plan view of the semiconductor element to which the test current is applied by the current application device illustrated in FIG. 1.

FIG. 6 is a plan view of the semiconductor element 22 to which the test current is applied by the current application device 1. As illustrated in FIG. 6, the semiconductor element 22 has the active area 23 in which a plurality of cells are disposed. The contact area 24 is set inside the active area 23. The contact area 24 is the portion to which the test current is applied by the current application device 1 when testing the semiconductor element 22.

When the test current is applied, each of the projections 21 on the contact surface 4 of the current application device 1 come in contact at a plurality of contact points 25 in the contact area 24, and current flows from the projections 21 into the vicinities of the contact points 25 corresponding thereto.

When applying the test current to the semiconductor element 22, the current application device 1 is positioned at a predetermined position with respect to the semiconductor element 22 by a semiconductor testing apparatus incorporating the current application device 1. At the predetermined position, the pressing assembly 3 presses the contact section 2 against the semiconductor element 22 by the arrangement of the pins with springs 6 under a pressure of, for example, 2.17 MPa so as to bring the projection group on the contact surface 4 into contact with the surface electrode 22a.

At this time, the contact section 2 is slightly tiltably guided by the cylindrical pin 10 and the projecting section 16, so that a slight inclination of the contact surface 4 relative to the surface of the semiconductor element 22 is accommodated by the difference in the amount of contraction of the pins with springs 6, thus allowing the projections 21 of the contact surface 4 to come in contact with the surface of the semiconductor element 22 with a substantially even pressing force.

Figure 7:
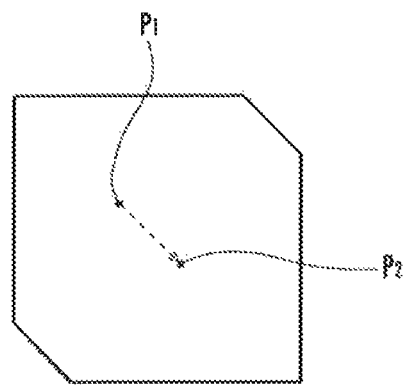
FIG. 7 is a diagram illustrating the movement of the apex of a projection, which is provided on the contact section illustrated in FIG. 3, on the surface of the semiconductor element.

Then, when the contact surface 4 of the contact section 2 is pressed against the semiconductor element 22 by the pressing assembly 3, the contact surface 4 is deformed from the curved shape to the planar shape. At this time, as illustrated in FIG. 3, the projections 21a, which are provided in the central portion of the contact surface 4 and oriented in the pressing direction before the pressing is started, penetrate the film to come in contact with the surface electrode 22a while maintaining the orientations thereof Meanwhile, the projections 21b and 21c, which are provided in the peripheral portion of the contact surface 4 and oriented in directions at angles relative to the pressing direction before the pressing is started, change the orientations thereof to the pressing direction as the contact surface 4 is deformed, thereby scraping the film off to penetrate the film so as to come in contact with the surface electrode 22a. At this time, as illustrated in FIG. 7, the projections 21b and 21c provided in the peripheral portion of the contact surface 4 scrape off the film of the area portions with which the distal ends of the projections 21b and 21c come in contact as the distal ends thereof move from a position $P_1$ to a position $P_2$ in the direction of the diagonal line of the quadrangle, thus exposing a larger portion of the surface electrode 22a. As the distal ends of the projections 21b and 21c move in the direction of the diagonal line of the quadrangle, the bottom surface of the quadrangle changes to a shape by extending in the direction of the diagonal line, as illustrated in FIG. 7.

As described above, according to the current application device 1 of the present embodiment, a larger portion of the surface electrode 22a of the semiconductor element 22 is exposed, as compared with the case of a conventional current application device. Hence, when the test current is applied to the semiconductor element 22, the electrical contact between the distal ends of the projections 21 of the contact section 2 and the surface electrode 22a of the semiconductor element 22 is improved, thus permitting further accurate testing of the electrical characteristics of the semiconductor element 22.

In particular, the projections 21 which are closer to the peripheral portion away from the central portion of the contact surface 4 are inclined at a larger degree relative to the pressing direction before the pressing is started, so that the displacements thereof are greater when the directions thereof are changed at the time of pressing, resulting in greater movement distances of the distal ends of the projections 21. For example, if the distances of the projections 21 from the central portion of the contact section 2 are, for example, 0/0.3/0.5/0.6 cm, then the movement distances of the distal ends of the projections 21 at the time of pressing will be 0/1/7/9 μm, respectively. This enables the projections 21 which are closer to the peripheral portion away from the central portion of the contact surface 4 to scrape off more of the film of the semiconductor element 22, leading to improved electrical contact between the projections 21 of the contact section 2 and the surface electrode 22a even in the peripheral portion of the semiconductor element 22.

For example, in the current application device provided with a conventional planar contact section, the contact resistances of projections at the central portion of a contact surface and the projections at the peripheral portion thereof range from 20 to 200Ω, and poor contact has been taking place especially with projections in the peripheral portion. In contrast, the current application device 1 of the present embodiment is capable of narrowing the contact resistance range to 20 to 40Ω, thus making it possible to solve the poor contact problem with the projections 21 in the peripheral portion, resulting in reduced contact resistance as a whole.

Figure 8A:
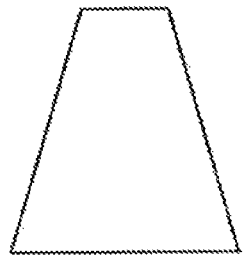
Figure 8B:
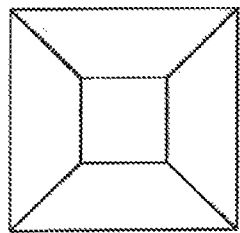

In the current application device 1 of the present embodiment, the projections 21 are shaped like a square pyramid, but are more preferably shaped like a truncated square pyramid, which has a flat top as illustrated in FIG. 8A and FIG. 8B. Further, if the projections 21 are shaped like the truncated square pyramid, then the length of one side of the distal surface thereof is preferably larger than an arithmetic mean roughness Ra of the uneven surface of the semiconductor element 22.

Figure 8C:
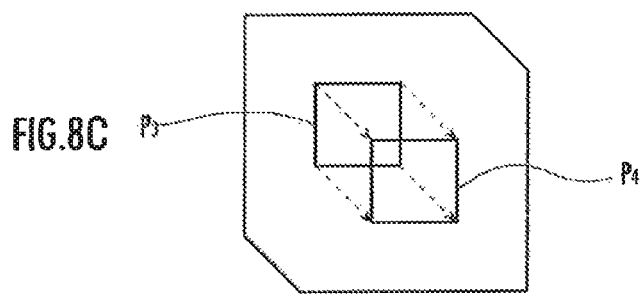

If the projection 21c is shaped like the square pyramid, then the single apex of the distal end of the square pyramid moves from a position $P_1$ to a position $P_2$, scraping off the film of the semiconductor element 22, as illustrated in FIG. 7. Meanwhile, if the projection 21c is shaped like the truncated square pyramid, then the square distal surface moves from a position $P_3$ to a position $P_4$ in the diagonal direction, as illustrated in FIG. 8C. As the distal surface moves, the film of the semiconductor element 22 is scraped off, exposing an even larger area of the surface electrode 22a with resultant further improved electrical contact, as compared with the case where the projections 21 are shaped like the square pyramid.

Further, if the dimension of one side of the distal surface of each of the projections 21 is larger than the arithmetic mean roughness Ra of the uneven surface of the semiconductor element 22, then the distal surface of the projection 21 can be spanning over a recession of the semiconductor element 22 to bring the distal surface of the projection 21 into contact with the surface electrode 22a of the semiconductor element 22. This leads to further improved electrical contact.

The shape of the projections 21 is not limited to a multangular pyramid or a truncated multangular pyramid and may be a cone or a truncated cone insofar as the shape secures conduction through good contact as described above.

Lastly, the manufacturing method of a semiconductor element in accordance with the present invention will be described.

As illustrated in FIG. 9, the manufacturing method of an embodiment includes a step ST1 for forming a semiconductor element, a testing step ST2 for inspection by applying a test current by using the foregoing current application device 1 to determine the quality of the semiconductor element formed in the step ST1, a step ST3 for determining whether or not the semiconductor element to which the test current has been applied in the step ST2 has been damaged, a step ST4 for determining that the tested semiconductor element is non-defective according to a determination result in the step ST3, and a step ST5 for determining that the tested semiconductor element is defective.

In this case, the testing step ST2 corresponds to the current application step in the manufacturing method according to the present invention, and the determination steps ST3 to ST5 correspond to the determination step for determining whether or not a semiconductor element satisfies a predetermined performance in the manufacturing method according to the present invention.

In the foregoing embodiment, the current application test is carried out in the step ST2 on a semiconductor element manufactured by a publicly known manufacturing technique in the forming step ST1. This is a test method used for evaluating the durability of the reverse bias safe operating area (RBSOA) of an insulated gate bipolar transistor (IGBT), as described in, for example, Japanese Patent Application Laid-Open No. 2006-284490. The RBSOA denotes the non-destructive operation range of the voltage between a collector and an emitter and a collector current when the IGBT is turned off. As the range widens, it means that the non-destructive performance against reverse bias is high.

Thus, in the testing step ST2, the current application device 1 is used to apply a large current to a semiconductor element to be tested. For example, if the design value (the rated current) of an RBSOA is 500 A, then a current of 1000 A is applied. It is then verified whether or not the semiconductor element to which the test current has been applied satisfies a predetermined performance thereby to determine whether or not the semiconductor element has been damaged (the step ST3). If the test result indicates that the semiconductor element has not been damaged, then the semiconductor element is determined as non-defective (the step ST4), or if the test result indicates that the semiconductor element has been damaged, then the semiconductor element is determined as defective (the step ST5).

According to the method of the present embodiment, semiconductor elements that are properly tested by using the current application device providing excellent electrical contact between the projections of the contact section and the surface electrode 22a of the semiconductor element are manufactured as described above.

What is claimed is:

1. A current application device that applies a test current to a semiconductor element having at least a part of a surface electrode covered with an electrical insulation film, comprising:
    a contact section having a plurality of projections that penetrate the electrical insulation film to come in contact with the surface electrode so as to apply the test current to the semiconductor element; and
    a pressing section that presses the contact section against the semiconductor element so that the projections penetrate the electrical insulation film to come in contact with the surface electrode,
    wherein the contact section has the plurality of projections on a plane formed in a curved shape, and the plane having the curved shape is deformed into a planar shape when pressed by the pressing section.

2. The current application device according to claim 1, wherein the plane of the contact section that has the plurality of projections is curved such that a central portion thereof projects toward an opposite side relative to the semiconductor element and a peripheral portion thereof projects toward the semiconductor element.

3. The current application device according to claim 1, wherein the projections have a pyramidal shape.

4. The current application device according to claim 1, wherein the projections have a frustum-like shape.

5. The current application device according to claim 4,
    wherein the projections have a truncated square pyramid shape, and
    a length of one side of the truncated square pyramid shape is larger than an arithmetic mean roughness of an uneven surface of the semiconductor element.

6. A manufacturing method of a semiconductor element, comprising:
    a formation step for forming a semiconductor element having at least a part of a surface electrode covered with an electrical insulation film;
    a current application step for pressing a contact section, which is provided with a plurality of projections on a plane formed in a curved shape, against the semiconductor element formed by the formation step thereby to deform the plane of the contact section that has the curved shape into a planar shape, and then scraping off and penetrating the electrical insulation film by the projections to bring the projections into contact with the surface electrode so as to apply a test current; and a determination step for determining whether or not the semiconductor element to which the test current is applied in the current application step satisfies a predetermined performance according to the test current.

7. The manufacturing method of a semiconductor element according to claim 6, wherein a distance of scraping-off of the electrical insulation film by the plurality of projections increases as positions of the projections provided on the contact section are closer to a peripheral portion away from a central portion.

* * * * *